United States Patent [19]

Schulman et al.

[11] Patent Number: 4,760,579
[45] Date of Patent: Jul. 26, 1988

[54] QUANTUM WELL LASER WITH CHARGE CARRIER DENSITY ENHANCEMENT

[75] Inventors: Joel N. Schulman, Agoura; Kavasseri V. Vaidyanathan, Westlake; Arthur L. Smirl, Thousand Oaks, all of Calif.

[73] Assignee: Hughes Aircraft Company, Los Angeles, Calif.

[21] Appl. No.: 880,853

[22] Filed: Jul. 1, 1986

[51] Int. Cl.⁴ ............................................. H01S 3/19
[52] U.S. Cl. ...................................... 372/45; 372/44; 357/16; 357/17
[58] Field of Search ..................... 372/44, 45; 357/16, 357/17

[56] References Cited

U.S. PATENT DOCUMENTS 4,365,260 12/1982 Holonyak ............................. 357/17
4,438,446 3/1984 Tsang ................................... 357/17
4,439,782 3/1984 Holonyak, Jr. ....................... 357/17

OTHER PUBLICATIONS

Vassell et al., "Multibarrier . . . Heterostructures", 54 Journal of Appl. Phy. 5206–5213 (Sep. 1983).
Tsuchiya et al., "Precise Control . . . ", vol. 25, No. 3, Journal of Applied Physics 185–187 (Mar. 1986).
Sollner et al., "Resonant . . . 2.5 THZ", 43 Applied Physics Letter 588–590 (Sep. 1983).
Sollner et al., "Quantum Well Oscillators", 45 Applied Physics Letters, 1319–1321 (Dec. 1984).
Holonyak, "Quantum Well Semiconductor Lasers", (Review) 19 Sov. Phys. Semicond., 943–958 (Sep.) 1985.

Primary Examiner—James W. Davie
Assistant Examiner—Xuan Vo
Attorney, Agent, or Firm—Terje Gudmestad; Paul M. Coble; A. W. Karambelas

[57] ABSTRACT

A resonant quantum well laser incorporates semiconductor barriers on one or both sides of the quantum well to increase the charge density within the quantum well. The composition of the injection layers can be tailored in a manner that the energies of the charge carriers in the injection layers are about that of a resonant energy level for that type of charge carrier in the quantum well. The barrier layers on one or both sides of the quantum well enhance the probability of the charge carrier being in the well for a longer time and travelling a longer distance, increasing the chance of scattering. The charge carriers, electrons or holes, can move from their respective injection layers into nearly identical energy levels within the quantum well, by tunneling through the thin barrier layers. The number of carriers which are available to transfer into the lasting energy level is increased, thereby increasing the efficiency of the laser and lowering its threshold current.

19 Claims, 4 Drawing Sheets

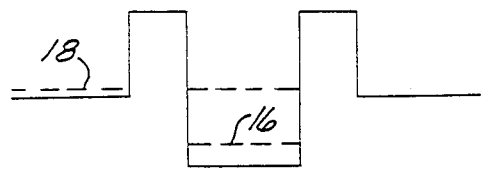
FIG. 8
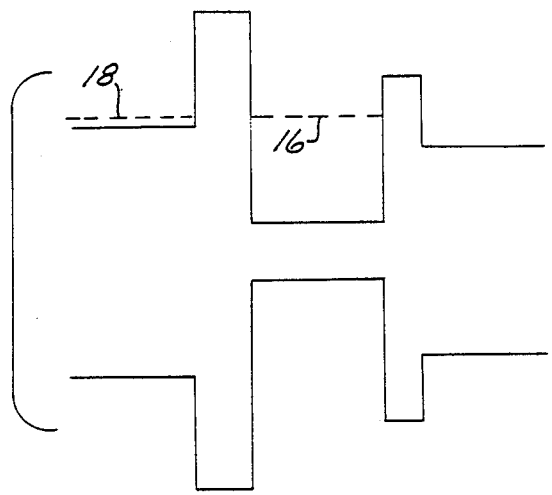
FIG. 9
FIG. 10
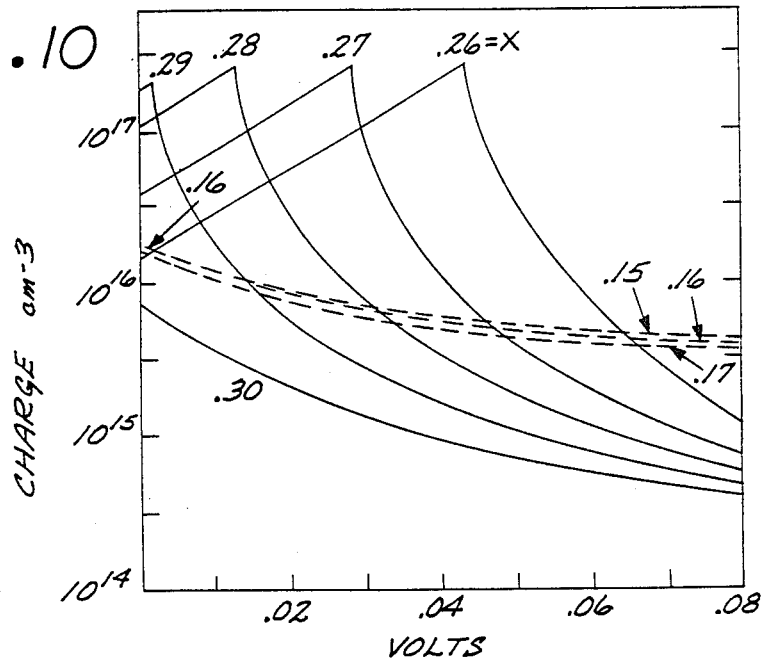

QUANTUM WELL LASER WITH CHARGE CARRIER DENSITY ENHANCEMENT

BACKGROUND OF THE INVENTION

This invention relates to semiconductor lasers, and, more particularly, to an improved quantum well semiconductor laser.

Lasers are devices that convert energy of one type to another type by quantum resonance phenomena. Typically, noncoherent radiation having a range of wavelengths or injected charge carriers are used to pump charge carriers to excited energy states, which then decay or combine with other charge carriers, resulting in the emission of coherent radiation having a narrow wavelength range.

Lasers have become important tools of science and industry, because they can produce very intense beams of energy, and because the energy has only a narrow wavelength range. Many devices use lasers for one or a combination of these reasons. Lasers are used in communications systems, metalworking machines, surgical instruments, and electronic semiconductor devices, to name a few applications.

One increasingly important type of laser is the semiconductor laser, whose operation is based upon the excitation and recombination of charge carriers in a semiconducting material. Such semiconducting lasers are typically quite small, and are used primarily in electronic applications. One improvement to the basic semiconductor laser is the quantum well laser, wherein a thin layer of a semiconductor lasing material, the quantum well, is sandwiched between layers of another semiconductor that serve as the sources of charge carriers that are injected into the quantum well. The dimensions of such quantum wells can be very small, on the order of about $10^{-8}$ meters in thickness. Accordingly, their primary application is found in opto-electronics and scientific investigations. Other types of quantum well lasers employ multiple alternating semiconductor interlayers in the quantum well, in a structure termed a multiple quantum well or superlattice, increasing the output power of the laser and permitting other variations and features.

One type of quantum well laser of particular interest for use in electronic devices is based upon gallium arsenide and its alloys. In the simplest form, this laser has a layer of GaAs, the quantum well, between two layers of AlGaAs material, the two outer layers having a heteroepitaxial relationship with the quantum well. Electrons are injected into the quantum well from one AlGaAs layer, and holes are injected into the quantum well from the other AlGaAs layer. The AlGaAs layers are of a chemical composition, such as $Al_{0.3}Ga_{0.7}As$, that have a band gap larger than GaAs in order to confine the charge carriers within the quantum well. If the charge carriers were not localized within the quantum well, the laser would not be as efficient and would lase at longer wavelengths. The energies of the charge carriers in the AlGaAs layers are determined by the composition of the layer. Since the band gap of AlGaAs increases with aluminum concentration, the chemical compositions of the AlGaAs layers required to maintain the resonant confinement result in energies of the electrons within the AlGaAs layers that are typically much higher than the respective energy levels in the quantum well.

In a conventional quantum well laser, charge carriers injected into the quantum well region must lose energy to achieve the energy level for lasing. If the charge carriers cannot lose energy quickly enough, they are not captured within the quantum well and are lost to the surrounding environment. The efficiency and power output of the quantum well laser are then considerably less than might be otherwise attained. This limitation on the efficiency of capturing charge carriers is particularly acute for very thin quantum wells having thicknesses of 100 Angstroms or less, and for the electron charge carriers, which have longer scattering lengths than do hole charge carriers. Both considerations decrease the time available for the energy loss of the electrons to the lasing energy of the well, thereby decreasing the efficiency of capture.

Thus, there is a need for a technique and structure for increasing the efficiency and output power of quantum well lasers, and decreasing their threshold current, particularly by increasing the capture or collection efficiency of the charge carriers in the quantum well. The technique should be compatible with the fundamental quantum well laser process and structure. Desirably, it would be applicable to a wide variety of quantum well laser constructions, but in any event allow improved operation of the gallium arsenide class of quantum well lasers. The present invention fulfills this need, and further provides related advantages.

SUMMARY OF THE INVENTION

The present invention is embodied in a modified structure of the quantum well laser, which permits increased flexibility in selection of the materials of construction, in turn yielding a structure that promotes an increased collection efficiency of both electron and hole charge carriers. Collection efficiency and laser output are increased substantially and threshold current lowered, because a much higher fraction of the injected charge carriers achieve the lasing level within the quantum well. The structure of the quantum well laser is changed, but the change is compatible with existing techniques of fabrication and operation of such lasers.

In accordance with the invention, an enhanced resonance quantum well laser comprises a quantum well having at least one layer of a semiconductor lasing material, the quantum well having a plurality of energy levels for electrons; an electron injection layer and a hole injection layer between which said quantum well is disposed, the electron injection layer supplying electrons to said quantum well at an energy level of about that of one of the energy levels for electrons in the quantum well, and the hole injection layer supplying the holes to the quantum well and having a composition such that the band gap of the hole injection layer is greater than that of the electron injection layer; and a first barrier layer between the quantum well and the electron injection layer, the first barrier layer having a band gap greater than that of the electron injection layer and being sufficiently thin to permit the electrons to tunnel from the electron injection layer into the quantum well, thereby increasing the number of electrons in the quantum well, the first barrier layer and the high band gap of the hole injection layer together increasing the probability of the electrons being within the region of the quantum well.

The quantum well laser may also be provided with a second barrier layer on the other side of the quantum well. Such a quantum well laser further includes a second barrier layer between the quantum well and the hole injection layer, the two barrier layers and high band gap of the hole injection layer together increasing the probability of the electrons being within the region of the quantum well. The two barrier layers and the two injection layers can be varied in composition, thickness and epitaxy to tailor the laser for maximum collection efficiency of the electrons and holes.

This type of structure is operable in conjunction with various materials of construction of quantum well lasers, including those based upon the gallium arsenide system. Normally, the barrier layers are less than 40 Angstroms in thickness, and more preferably about 10-20 Angstroms in thickness, to permit tunneling of charge carriers from the injection layers to the quantum well. However, the band gap of the barrier layers is sufficiently larger than that of the quantum well that a resonance level can be formed. It has been found desirable to select a composition for the injection layers which has a conduction band minimum and valence band maximum that is from about 0 to about 0.4 electron volts beyond the quantum well lasing energy level of the respective charge carriers. The structure of the present invention is compatible with both the simple quantum well having a single layer of lasing material, and also the multiple or superlattice quantum well designs wherein alternating layers of two semiconductor materials form the quantum well.

In accordance with another embodiment of the invention, an enhanced resonance quantum well laser comprises a quantum well having at least one layer of a semiconductor lasing material, the quantum well having a plurality of energy levels for electrons and a plurality of energy levels for holes; an electron injection layer and a hole injection layer between which the quantum well is disposed, the electron injection layer supplying the electrons to the quantum well at about the energy of one of the plurality of energy levels for the electrons in the quantum well, and the hole injection layer supplying the holes to the quantum well; a first barrier layer disposed between and contacting the quantum well and the electron injection layer; and a second barrier layer disposed between and contacting the quantum well and the hole injection layer, the barrier layers increasing the probability of the electrons being in the region of the quantum well, but being sufficiently thin to permit the electrons and holes to tunnel into the quantum well.

It is, of course, desirable to provide a structure that provides an enhanced probability for both types of charge carriers to be within the region of the quantum well, although it is far more important to provide a structure that increases the density of the electrons in the quantum well. Electrons have a longer scattering lengths for losing energy than do holes, and consequently are more likely to enter and leave a conventional quantum well without contributing to the lasing effect than are holes. More attention is therefore given to increasing the charge density of electrons in the quantum well through the approach of the present invention, and there is little problem with having a sufficient density of holes. Nevertheless, the compositions of the two injection layers can be made such that both types of carriers are injected into the quantum well at the proper energies.

In yet another embodiment, an enhanced resonance quantum well laser comprises a quantum well having at least one layer of a semiconductor lasing material, the quantum well having a plurality of energy levels for electrons; and an electron injection layer and a hole injection layer between which the quantum well is disposed, the electron injection layer supplying electrons to the quantum well at an energy of about that of one of the energy levels of electrons in the quantum well, and the hole injection layer having a band gap greater than the band gap of the electron injection layer, thereby increasing the probability of electrons being within the quantum well.

The presently most preferred embodiment of the quantum well laser of the invention is based upon a gallium arsenide construction. In one form, such a quantum well laser comprises a quantum well including a layer of GaAs, the quantum well having a plurality of energy levels for electrons; an electron injection layer of composition $Al_xGa_{1-x}As$ and a hole injection layer of composition $Al_yGa_{1-y}As$ between which the quantum well is disposed, the electron injection layer being the source to the quantum well of electrons and the hole injection layer being the source to the quantum well of holes, wherein x is such that the energy of the electrons in the electron injection layer is about that of one of the energy levels for electrons in the quantum well, and y is greater than x; and a first barrier layer between the quantum well and the electron injection layer, and having a composition of $Al_mGa_{1-m}As$, where m is greater than x and the first barrier layer has a thickness of less than about 40 Angstroms to permit electrons to tunnel from the electron injection layer into the quantum well. Optionally, a second barrier layer is disposed between the quantum well and the hole injection layer, and has a composition of $Al_nGa_{1-n}As$, where n is greater than y. In this optional approach using a second barrier layer, it is not necessary that y be greater than x.

In the gallium arsenide based quantum well laser, the two injection layers may be of the same composition for simplicity of fabrication and when used in conjunction with barrier layers, or may be of different composition to operate most efficiently for electrons and holes, which have different energy states in the quantum well. The compositions of the barrier layers may be similarly tailored. The exact compositions of the injection and barrier layers depend upon the energy levels chosen for injection, but typically x and y are from about 0.20 to about 0.40, and m and n are from about 0.20 to about 1.0.

The quantum well laser of the invention thus achieves improved operation by recognizing that two functions of the injection layer need not be combined within a single layer. In the present approach, the function of increasing the probability of an electron being in the quantum well is provided by thin barrier layers between the injection layer and the quantum well, or by a thin barrier layer between the electron injection layer and the quantum well and a modified composition of the injection layer from which the holes are injected. The composition of the electron injection layer can then be adjusted with less restriction to provide energy levels for the injected charge carriers that more closely match a resonance energy of the quantum well for each carrier. The carriers of the proper energy enter into the quantum well from the injection layer, as by tunneling through the barrier layer when present. Because the energy of the charge carriers upon injection closely matches that of a resonance of the well, the collection efficiency is very high and most of the injected carriers are captured within the quantum well. More excited electrons and holes are therefore present to recombine, so that the output and efficiency of the laser are improved. Equally as significant, the greater density of electrons results in a decreased threshold current requirement for operation of the quantum well laser, allowing the device to operate with less power and decreased noise.

It will be recognized that the present invention constitutes an important advance in the art of semiconducting quantum well lasers. Collection efficiency of injected charge carriers is increased, resulting in significantly higher laser output power and efficiency, and reduced threshold current. Other features and advantages of the present invention will become apparent from the following more detailed description, taken in conjunction with the accompanying drawings, which description illustrates, by way of example, the principles of the invention.

BRIEF DESCRIPTION OF THE DRAWINGS

FIG. 8 is a schematic energy band diagram illustrating another approach to matching of energy levels in the laser of FIG. 4;

FIG. 9 is a schematic energy band diagram of a laser in accordance with the present invention, which is optimized for electron and hole collection efficiency; and FIG. 10 is a calculated graph of charge carrier density in the quantum well as a function of applied voltage, for various configurations of the quantum well laser.

DETAILED DESCRIPTION OF THE PREFERRED EMBODIMENT

Figure 1:
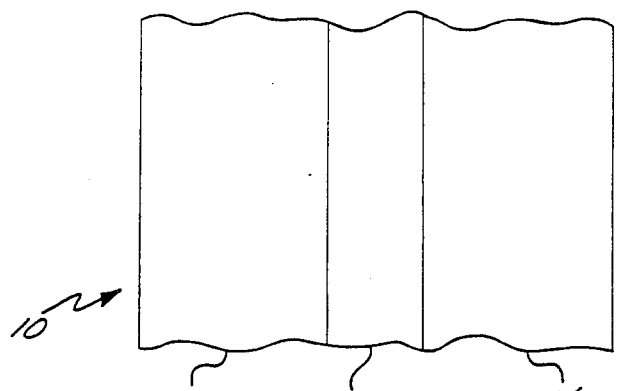
FIG. 1 is side sectional view of a conventional quantum well laser.
Figure 2:
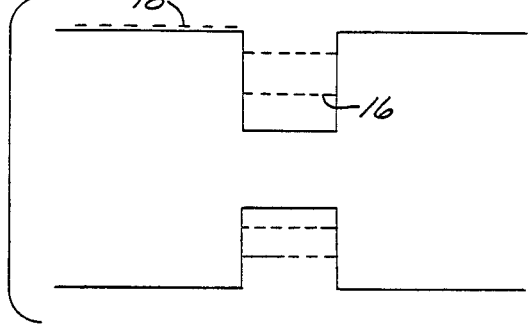
FIG. 2 is a schematic energy band diagram of the laser of FIG. 1.

By way of background information, FIG. 1 illustrates a conventional quantum well laser 10, and FIG. 2 illustrates its relevant energy levels. The conventional quantum well laser 10 has a quantum well 12, typically GaAs, having a thickness of on the order of 100 Angstroms. On either side of the quantum well 12 and heteroepitaxially contacting it are two injection layers 14, which may be of a related composition such as $Al_{0.3}Ga_{0.7}As$. The total thickness of the injection layers 14 plus the quantum well 12 is on the order of $1 \times 10^{-7}$ meters. Electrons are injected from the injection layer 14 on one side of the quantum well 12, while holes are injected from the other injection layer 14. The injection layers 14 confine the charge carriers within the quantum well 12 at the confined lasing energy 16 due to their higher band gap.

Figure 3:
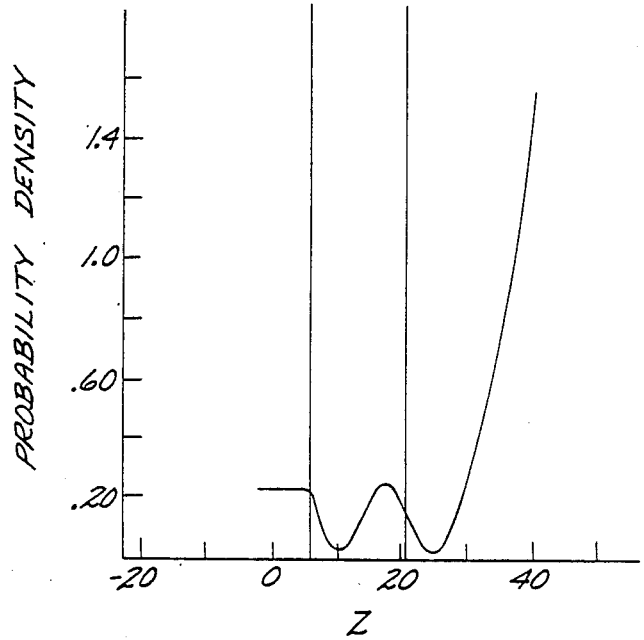
FIG. 3 is a calculated graph of the probability distribution of an electron in the laser of FIG. 1.

To perform its function, the injection layer 14 must have a composition which results in a band gap greater than that of the quantum well 12. It is observed that the electron energy level 18 is much higher than the lasing energy 16 for electrons within the quantum well 12. Consequently, the electron must lose the difference in energy to be captured within the quantum well 12. FIG. 3 illustrates, for one typical case, the results of a quantum mechanical calculation of the probability of finding an electron above but near the energy of the injection layer 14 conduction band minimum within the region of the quantum well 12. (In FIG. 3, the electron is injected from the right.) As is apparent, the charge density is rather low, indicating a difficulty in capturing the electrons within the quantum well 12.

Figure 4:
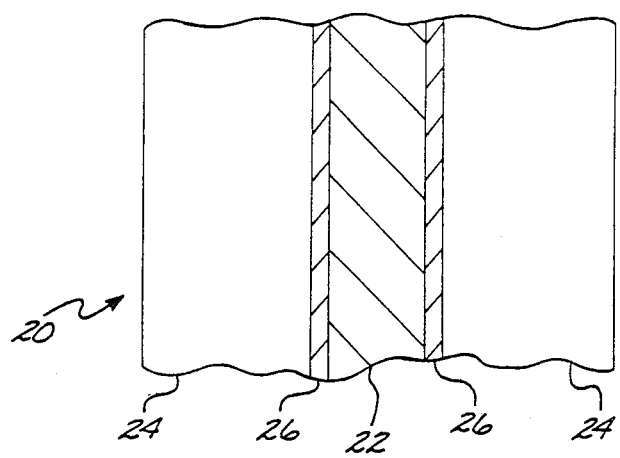
FIG. 4 is a side sectional view of a quantum well laser in accordance with the present invention.

The improved quantum well laser using resonant tunneling of the present invention, illustrated in FIG. 4, succeeds in increasing the probability of an electron being in the quantum well during operation. An improved quantum well laser 20 includes a quantum well 22, which is disposed between two semiconductor injection layers 24. The quantum well 22 performs essentially the same function as the quantum well 12 of the laser 10. The semiconductor injection layers 24 inject charge carriers into the quantum well 12, one layer 24 injecting the electrons and the other injecting the holes. However, the injection layers 24 are not in direct contact with the quantum well 22.

Interposed between the quantum well 22 and each of the injection layers 24 is a barrier layer 26 of a semiconductor material in a sufficiently thin layer that the charge carriers (electrons and holes, respectively) can tunnel from the injection layer 24, through the barrier layer 26, and into the quantum well 22, thus accomplishing the function of injecting charge carriers into the quantum well 22. A thickness of the barrier layer of less than about 40 Angstroms is usually sufficiently thin to permit tunneling, but the greater the thickness, the lower the tunneling current.

The chemical composition of the barrier layer 26 is selected to create a resonance in the well with a large probability of finding electrons there. The thicker the barrier layer 26, the more effective is the probability enhancement, but the lower is the tunneling current of charge carriers injected into the quantum well 22. Selection of optimum compositions is a matter of optimization for each material system, and is illustrated below for the gallium arsenide system.

Since the electron capturing function is accomplished largely by the barrier layer 26, the chemical composition of the injection layer 24 may be varied for optimum energetic characteristics of the injected electrons. Specifically, the chemical composition of the injection layer 24 is chosen to have a conduction band minimum energy for the charge carrier being injected from each layer 24 that is about that of the resonance energy of that charge carrier in the quantum well 22. (The resonance energies for electrons and holes in the quantum well are different, and therefore it may be desirable to have different compositions for the injection layer 24 from which the electrons are injected into the quantum well, and for the injection layer 24 from which the holes are injected into the quantum well.)

Figure 5:
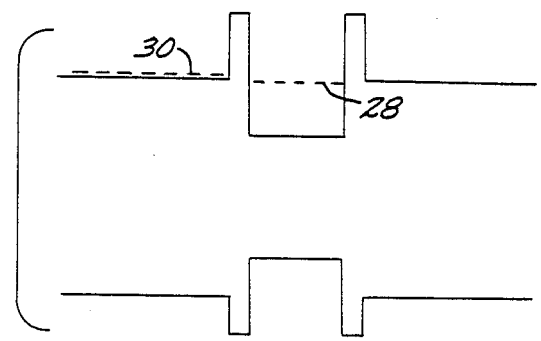
FIG. 5 is a schematic energy band diagram of the laser of FIG. 4.

FIG. 5 illustrates the energy band diagram for the quantum well laser of FIG. 4. The allowable energy levels 28 of the electrons in the quantum well 22 are determined by the choice of the lasing material in the quantum well, here illustrated as GaAs, and the geometry of the quantum well. The injection layer material is selected as an alloy of AlGaAs, whose composition may be varied widely to obtain a conduction band minimum 30 for the electrons that closely matches that of one of the electron energy levels 28 of the quantum well 22. Since the containment function is accomplished by the barrier layer 26, this consideration no longer restricts the alloy composition of the injection layer 24.

By matching the conduction band minimum 30 of the electrons in the electron injection layer 24, from which the electrons are injected, with one of the energy levels 28 required of the electrons when they reach the quantum well 22, the electrons are not required to undergo any significant change in energy to be captured within the quantum well 22, in the event that they are injected directly into the lasing energy level. If the electrons are injected into a higher but broader energy level, they must lose energy, but the increased probability density there lengthens the time available for the electrons to scatter and thence lose energy. Consequently, in either case a higher fraction of the injected charge carriers are retained within the quantum well 22.

Figure 6:
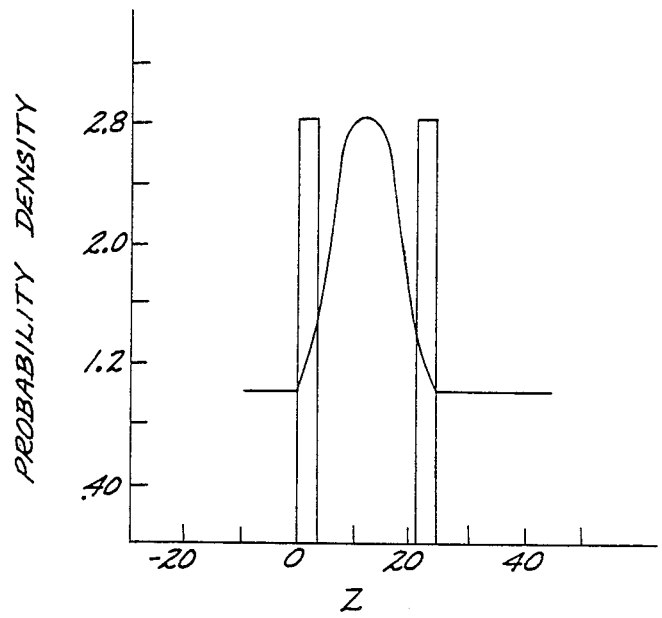
FIG. 6 is a calculated graph of the probability distribution of an electron in the laser of FIG. 4.

FIG. 6 illustrates the results of a quantum mechanical calculation of the probability of finding an electron with energy above but near the energy of the injection layer conduction band minimum, which may be compared with the corresponding FIG. 3 for a conventional quantum well laser 10. The probability is over 10 times higher in the laser using the enhanced resonance approach of the present invention. As a result, it is expected that the output and efficiency of the resonant tunneling laser 20 is much improved over the conventional laser.

Figure 7A:
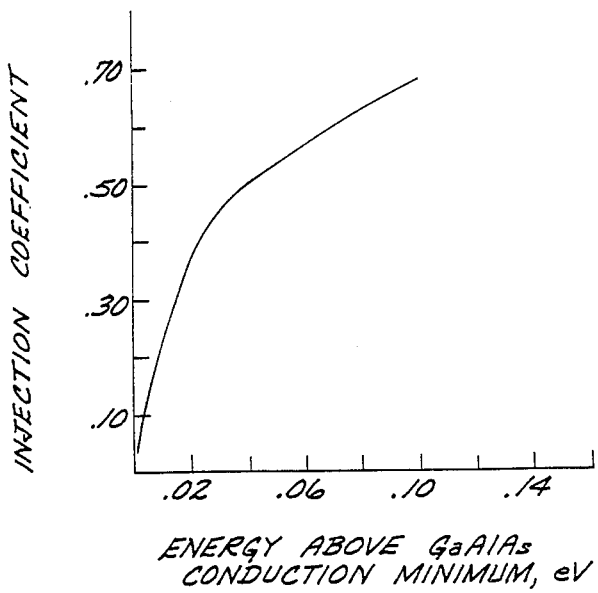
FIG. 7 are calculated graphs of the injection coefficient for the laser of FIG. 1 (FIG. 7A) and for the laser of FIG. 4 (FIG. 7B)
Figure 7B:
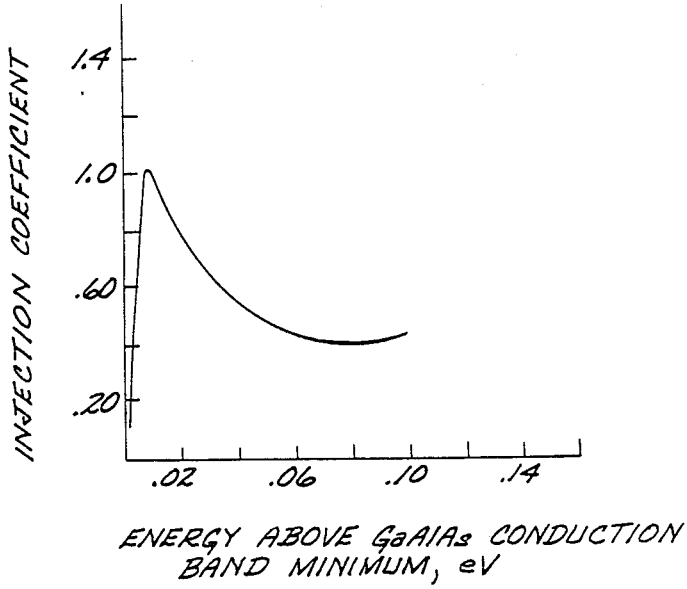

A further quantum mechanics calculation is employed to calculate the injection coefficient of electrons as a function of their energy above the injection layer conduction band minimum. The injection coefficient is defined as the probability that the electron penetrates through the barrier layers. If an electron penetrates both layers, then it must have spent time within the well so that a scattering event may occur. A comparison of the two graphs of FIGS. 7A and 7B demonstrates that the injection coefficient for electrons near to the conduction band minimum is greatly increased when the present approach is used, FIG. 7B, as compared with a conventional quantum well laser, FIG. 7A.

The energy of the charge carrier in the injection layer 24 can also be adjusted to other values, such as the second or higher energy level of the quantum well 22, as illustrated in FIG. 8. Injection into the higher quantum energy level has the disadvantage of requiring a loss of energy of the injected electron to the resonance level, but has the advantages of allowing a more narrow lasing level and of avoiding reabsorption of the generated light by the injection layers which then have the same band gap as the quantum well.

One disadvantage of using barrier layers 26 on each side of the quantum well 22 is the need for the holes to tunnel through the barrier layer into the well. This problem can be overcome by using different barrier layer compositions and thickness, and different injection layer compositions, for the sides from which the electrons and the holes are injected, as schematically illustrated in FIG. 9.

In yet another embodiment of the present invention, the separate barrier layer on the hole injection layer side can be omitted, and the injected electrons confined by increasing the band gap of the injection layer 24 from which the holes are injected. It will be recalled that the injected holes, having a relatively short scattering distance, can lose sufficient energy relatively easily to enter the hole lasing level. The electrons, on the other hand, have much longer scattering lengths, and more aid must be given to confine the injected electrons to remain within the quantum well until a sufficient energy loss occurs.

Therefore, improved resonance can be achieved by adjusting the composition of the injection layer 24 from which the electrons are injected to a value so that the electrons have an energy about that of one of the energy levels in the quantum well when injected. The composition of the injection layer 24 from which the holes are injected is adjusted so that its conduction band is significantly increased, thereby acting to confine the electrons within the quantum well and preventing them from reaching the second injection layer. The injection of the holes is therefore not optimized, but a sufficient supply of holes is still available due to their inherently greater energy loss rate within the quantum well.

FIG. 10 illustrates the calculated optimization of composition for the above configuration and for the conventional quantum well, in a graph of the charge density in the well as a function of the voltage across the quantum well and barriers. The calculation is based on a two-band tight binding model where the band gap and effective masses are for GaAs and AlGaAs. The quantum wells of the invention achieve improvements of charge density in the well of over an order of magnitude at zero applied voltage. The exact charge density depends upon both the configuration and the composition of the barrier. For example, in the configuration just discussed, optimum performance is obtained with about 29 atomic percent aluminum in the gallium arsenide, but this optimization figure varies with other geometries and compositions, and presumably for other materials.

It will now be appreciated that the improved resonance quantum well laser of the present invention provides significantly improved performance as compared with prior quantum well lasers by increasing the charge density of carriers within the quantum well. The same kinds of materials and techniques can be used in fabricating the improved quantum well lasers as used in prior quantum well lasers, but these materials are combined in different arrangements. Although particular embodiments of the invention have been described in detail for purposes of illustration, various modifications may be made without departing from the spirit and scope of the invention. Accordingly, the invention is not to be limited except as by the appended claims.

What is claimed is:

1. In an enhanced resonant quantum well laser wherein a quantum well region of at least one layer of semiconductor lasing material with a plurality of energy states for electrons is disposed between an electron injection layer and a hole injection layer, said electron injection-layer being the source of electrons to said quantum well region and said hole injection layer being the source of holes to said quantum well region, the improvement comprising:

said electron injection layer supplying electrons to said quantum well at an energy level of about that of one of the energy levels for electrons in said quantum well region and said hole injection layer having a composition such that the bandgap of the hole injection layer is greater than that of the electron injection layer; and a barrier layer disposed between said quantum well and said electron injection layer, said barrier layer having a bandgap greater than that of the electron injection layer and being sufficiently thin to permit electrons to tunnel from said electron injection layer into said quantum well region, said barrier layer and the greater bandgap of said hole injection layer together increasing the probability of electrons being within said quantum well region.

2. The improvement according to claim 1 wherein said barrier layer is less than about 40 Å thick.

3. The improvement of claim 1 wherein said barrier layer is in the range of about 10 to 20 Å in thickness.

4. The improvement according to claim 1 wherein said semiconductor lasing material is gallium arsenide.

5. The improvement according to claim 1 wherein the barrier layer is of an aluminum gallium arsenide alloy.

6. The improvement according to claim 1 wherein said electron injection layer is of an aluminum gallium arsenide alloy.

7. The improvement of claim 1 wherein said quantum well region comprises a plurality of alternating layers of two semiconductor materials.

8. The improvement according to claim 1 wherein the conduction band minimum of said electron injection layer is from about 0 to 0.4 electron volts beyond the quantum well region lasing energy level of the electrons.

9. The improvement according to claim 1 further comprising a further barrier layer disposed between said quantum region and said hole injection layer, said further barrier layer having a bandgap greater than that of said hole injection layer and being sufficiently thin to permit the holes to tunnel from said hole injection layer into said quantum well region.

10. The improvement according to claim 9 wherein said barrier layer and said further barrier layer are of different compositions and thicknesses.

11. The improvement according to claim 7 wherein said further barrier layer is less than about 40 Å thick.

12. The improvement according to claim 9 wherein said further barrier layer is in the range of about 10 to 20 Å thick.

13. In an enhanced resonant quantum well laser wherein a quantum well region of at least one layer of a semiconductor lasing material with a plurality of energy levels for electrons and a plurality of energy levels for holes is disposed between an electron injection layer and a hole injection layer, said electron injection layer being the source of electrons to said quantum well region and said hole injection layer being the source of holes to said quantum well region, the improvement comprising:

said electron injection layer supplying electrons to said quantum well region at about the energy of one of the plurality of energy levels for the electrons in the quantum well region, and said hole injection layer plying holes at about the energy of one of the plurality of energy levels for the holes in said quantum well region;

a first barrier layer disposed between and contacting said quantum well region and said electron injection layer, said first barrier layer having a bandgap greater than that of the electron injection layer and being sufficiently thin to permit electrons to tunnel from said electron injection layer into said quantum well region; and a second barrier layer disposed between and contacting said quantum well region and said hole injection layer, said second barrier layer having a bandgap greater than that of the hole injection layer and being sufficiently thin to permit holes to tunnel from said electron injection layer into said quantum well region, said first and second barrier layers increasing the probability of electrons and holes being in the said quantum well region.

14. The improvement according to claim 13 wherein said first barrier layer is less than about 40 Å thick.

15. The improvement according to claim 13 wherein said second barrier is less than about 40 Å thick.

16. In an enhanced resonant quantum well laser wherein a quantum well region of at least one layer of a semiconductor lasing material with a plurality of energy levels for electrons is disposed between an electron injection layer and a hole injection layer, said electron injection layer being the source of electrons to said quantum well and said hole injection layer being the source of holes to said quantum well, the improvement comprising:

said electron injection layer being made of $Al_xGa_{1-x}As$, x being a fractional number between 0 and 1, and said hole injection layer being made of $Al_yGa_{1-y}As$, y being a fractional number between 0 and 1, wherein x is such that the energy of the electrons in said electron injection layer is about that of one of the energy levels for electrons in said quantum well region; and a barrier layer between said quantum well and said electron injection layer and having a composition of $Al_mGa_{1-m}As$, m being a fractional number between 0 and 1, where m is greater than x and said barrier layer has a thickness of less than about 40 ÅA to permit electrons to tunnel from said electron injection layer into said quantum well region.

17. The improvement according to claim 16 wherein x is substantially equal to y.

18. The improvement according to claim 16 wherein y is greater than x.

19. The improvement according to claim 16 further comprising a further barrier layer between said quantum well and said hole injection layer, and having a composition of $Al_nGa_{1-n}As$, n being a fractional number between 0 and 1, wherein n is greater than y.

* * * * *